United States Patent [19]

Wada

[11] Patent Number: 4,508,048
[45] Date of Patent: Apr. 2, 1985

[54] POINTER MECHANISM

[75] Inventor: Hideo Wada, Tokyo, Japan

[73] Assignee: Clarion Co., Ltd., Tokyo, Japan

[21] Appl. No.: 410,730

[22] Filed: Aug. 23, 1982

[30] Foreign Application Priority Data

Aug. 31, 1981 [JP] Japan ............................ 56-128788[U]

[51] Int. Cl.³ ............................ H03J 1/04; H03J 1/02
[52] U.S. Cl. ..................................... 116/291; 74/10.1; 116/331; 116/DIG. 6; 116/241
[58] Field of Search ................ 116/291, 315, DIG. 6, 116/331, 328, 327, 294, 313, 312, 241; 74/10.41, 10.1, 10.7, 10.9

[56] References Cited

U.S. PATENT DOCUMENTS

| | | | |
|---|---|---|---|
| 2,319,782 | 5/1943 | Rourke | 116/291 |
| 2,434,470 | 1/1948 | Rhodes | 116/DIG. 6 |
| 2,875,620 | 3/1959 | Heselwood | 74/10.7 |
| 3,006,312 | 10/1961 | Bradley | 116/328 |
| 3,689,853 | 9/1972 | Badger | 74/10.41 |

Primary Examiner—Charles Frankfort
Assistant Examiner—Denis E. Corr
Attorney, Agent, or Firm—Flynn, Thiel, Boutell & Tanis

[57] ABSTRACT

At an extremity of the pointer board of a push-button tuner is fixed a member on which a pointer is mounted. At a surface of the member on which the pointer is mounted. There is disposed a lateral fitting groove having an opening at the front surface. The fitting groove is provided with indentations. The pointer has a fitting portion engaging with the fitting groove on its back surface and the fitting portion has protrusion engaging with one of the indentations.

1 Claim, 4 Drawing Figures

POINTER MECHANISM

BACKGROUND OF THE INVENTION

1. Field of the Invention

This invention relates to a pointer mechanism, which is suitable for a push-button tuner, etc., specifically to an improvement of an adjustable pointer mechanism.

2. Description of the Prior Art

Generally, for a push-button tuner, an indicator is provided to display a tuning frequency selected by manipulating one of the push-buttons. This indicator displays mechanically the tuning frequency and is so constructed that its pointer indicates correctly the position on a scale in frequency by selection of a broadcast station by turning a manual tuning dial or by pressing a desired button.

An example of this type of indicator is shown in FIG. 1. An upper plate 2 is disposed on the push-buttons 1. On this upper plate 2 are disposed a bar-shaped link 3, a chevron-shaped link 4 and a T-shaped pointer board 5, which are mutually coupled. That is, an extremity of the bar-shaped link 3 is coupled by a coupling pin 20 with the upper plate 2, and the other extremity of the bar-shaped link 3 is coupled by a coupling pin 21 with an extremity of the horizontal member of the T-shaped pointer board 5. On the other hand, the other extremity of the horizontal member of the T-shaped pointer board 5 is coupled by a coupling pin 22 with an extremity of the chevron-shaped link 4 and the other extremity of the chevron-shaped link 4 is coupled with a core slide 23, which in turn is linked with the dial or the push-buttons.

In a push-button tuner, movements of a dial or a push-button are thus transformed, by a well-known manner, through the bar-shaped link 3 and the chevron-shaped link 4 into deviations right or left of the pointer board 5, and the pointer at the extremity of this pointer board 5 indicates a selected frequency. Consequently, when the links 3 and 4 and the pointer board 5 are mounted, tolerances and fluctuations in length of each part, diameters of the coupling pins and the coupling holes, into which the pins are inserted, as well as displacement strokes of the core slide etc. for moving the pointer, give rise to errors or incorrectness in position of the extremity of the pointer board, and it is necessary to read just the position of the pointer during the last fabrication step.

Heretofore, bending of the plate of the pointer board 5 (plastic deformation) has been utilized as adjusting means of the pointer. That is, the T-shaped pointer board 5 is made of a metallic plate, which is provided with notches 6 at both sides, and a pointer 7 is fixed at an extremity of the pointer board 5 so as to protrude upwardly. In order to adjust the position of the pointer of such a conventional indicator, the pointer has been displaced at a desired position by bending right or left the pointer board 5 at a portion having notches 6.

However, for this conventional type of indicator, the pointer 7 thus adjusted is, as shown in FIG. 2, retreated back by Δl with respect to its original position. Moreover, the pointer 7 becomes more distant from the scale board by this adjustment and this gives rise to errors in frequency indication of the pointer, depending upon the position of the eyes of the observer. For these reasons this conventional type of indicator had a disadvantage that correct indication in frequency was difficult. Furthermore, since it was bending of a metallic plate that was utilized for adjustment, the number of adjustments of the pointer was restricted. Therefore, it was also a disadvantage that the pointer was easily broken at the portion having the notches 6, when readjustment was repeated several times. Moreover, the distance between the pointer 7 and the notches should be so long that the indicator is easily readjusted by bending of the pointer board at the portion having the notches 6 and has a predetermined large range of adjustment. This length necessitates inevitably that the pointer board has certain large dimensions, what influences the largeness of the whole tuner and prevents reduction in size of the tuner. Further, there was another disadvantage that, since the metallic plate of the pointer board becomes thinner and thinner for the sake of reduction in weight, external force for bending it by readjustment of the pointer deformed the pointer board itself or loaded it so strongly that it had influences on the main part of the tuner.

OBJECTS OF THE INVENTION

It is an object of this invention to eliminate these disadvantages of the conventional indicators. Another object of this invention is to provide a pointer mechanism which is easily readjusted and can be reduced both in size and in weight.

SUMMARY OF THE INVENTION

In accordance with the present invention, there is provided a pointer mechanism for a push-button tuner having a pointer board movable in response to tuning manipulation of a push-button or a dial, comprising:

a pointer mounting member fixed at said pointer board, said pointer mounting member having a fitting groove formed laterally, which has an opening at the front surface of said pointer mounting member, indentations being formed at least at a part of the upper and lower borders of the fitting groove and the opening, and a pointer member, said pointer member having a fitting portion at its back side, which portion engages with the fitting groove; said fitting portion having at least one protrusion engaging with one of said indentations.

BRIEF DESCRIPTION OF THE DRAWINGS

This invention will be described hereinbelow more concretely by using an embodiment referring to FIGS. 3 and 4. In the drawing.

DETAILED DESCRIPTION OF THE PREFERRED EMBODIMENTS

Figure 1:
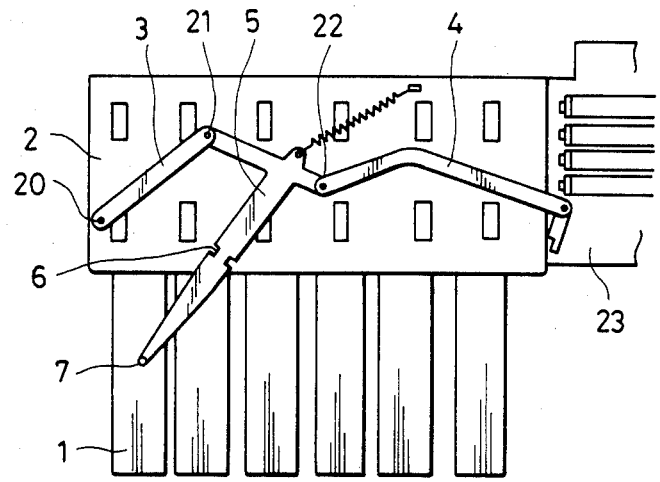
FIG. 1 is a plan view of a conventional pointer mechanism.
Figure 2:
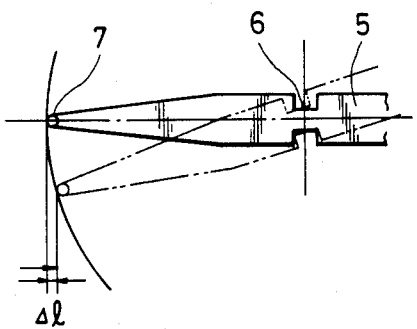
FIG. 2 is a plan view for explaining a backward displacement of the pointer by readjustment for the conventional pointer mechanism shown in FIG. 1.
Figure 3:
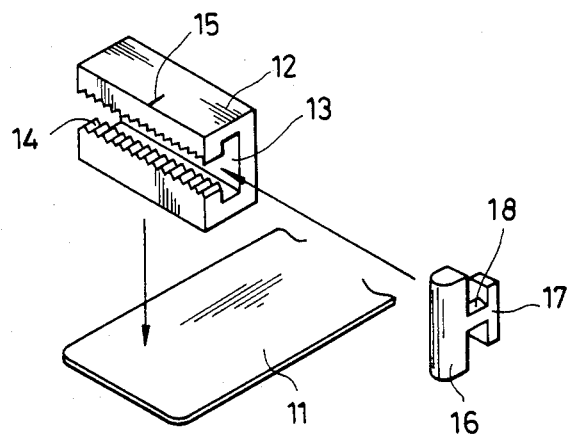
FIG. 3 is a perspective view of an exploded pointer mechanism according to this invention.
Figure 4:
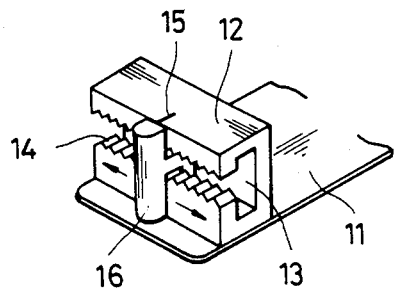
FIG. 4 is a perspective view of an assembled same mechanism.

On a pointer board 11, which can move in response to manipulation of a push-button of a push-button tuner or a manual tuning dial, just as for the pointer board 5 shown in FIG. 1, is fixed a pointer mounting member 12, e.g. made of synthetic resin. In this pointer mounting member 12 is disposed laterally a fitting groove 13 having a T-shaped cross section, which has an opening at the front surface of the member 12. Rows of indentations 14 are disposed on both upper and lower borders of the opening of the fitting groove 13. These indentations 14 have predetermined width and depth in an extent which is suitable for adjustment of the pointer. When the adjustment range is from 4 to 6 mm wide both right and left from its center, the teeth are about 0.3 mm wide and 0.3 mm high. Further, the center 15 of the rows of indentations is indicated on the upper surface of the pointer mounting member 12 so that the center is easily known.

On the other hand, on the back surface of the pointer 16 which is disposed perpendicularly, is disposed a fitting portion 17 having a T-shaped cross section which engages with the fitting groove 13. On the part near the root of the fitting portion 17 are disposed two mountain-shaped protrusions 18, 18 at the upper and lower sides, which engage with the indentations 14 of the pointer mounting member 12.

Hereafter will be explained a method for mounting and adjustment of the pointer mechanism having such a construction according to this invention.

At first the fitting portion 17 of the pointer 16 is inserted in the fitting groove 13 of the pointer mounting member 12 and the pointer 16 is fixed at the center 15 of the indentations 14. The pointer mounting member 12 is mounted at the extremity of the pointer board 11, and after that, the pointer 16 is adjusted by displacing it right or left on the indentations 14 during the last step for mounting the tuner. Since the pointer mounting member 12 is made of synthetic resin, teeth defined between adjacent indentations 14 are deformed reversibly by compression by the protrusions 18 displacing right and left and the protrusions 18 engage with a pair of the indentations 14 and is fixed on them. Consequently, fine adjustment is sufficient for one pair of the indentations 14 in order to fix the pointer 16 at a desired position.

As explained above, the pointer mechanism according to this invention is so constructed that the pointer can be displaced on the pointer mounting member, which is fixed at the extremity of the pointer board. Consequently it is not necessary to deform the pointer board itself, and thus the pointer board may be short. Therefore, the pointer mechanism according to this invention is suitable to reduction in size of the tuner. Further, since the position of the pointer is not adjusted by deformation of the metallic plate, this invention has advantages that influences of the adjustment on the tuner and on the pointer board are small, that the adjustment can be repeated, and that the adjustment range can be arbitrarily selected. Still further, this invention brings about an effect that the distance between the pointer and the scale board is not changed by the adjustment, because the pointer is displaced along the fitting groove of the pointer mounting member parallel to the scale board.

This invention is, of course, not limited to the embodiment shown in the drawing, but the pointer mounting member may be made of metal and the pointer may be made of synthetic resin. Further, both can be made either of synthetic resin or of metal. Still further, the indentations and the protrusion engaging with it may be disposed only on one border, and also on the inner part of the fitting groove.

I claim:

1. A pointer mechanism for a tuner which comprises:

an elongated pointer board mounted for lateral movement relative to said tuner in response to a tuning manipulation, said pointer board having an edge portion at one longitudinal end thereof;

an elongated pointer mounting member fixedly mounted on said edge portion of said pointer board and extending laterally thereon, said pointer mounting member having an elongated groove of substantially T-shaped cross section extending laterally therein, said T-shaped groove defining an opening through the outer surface of said pointer mounting member, said opening being narrower than the remainder of said groove, said pointer mounting member having opposed spaced-apart walls defining the opposite sides of the stem of said T-shaped groove, both of said walls being serrated to define a lengthwise row of indentations extending along said walls; and a pointer member having a pointer disposed in front of the outer surface of said pointer mounting member and having a substantially T-shaped fitting portion extending rearwardly therefrom and extending into and substantially filling the T-shaped cross section of said groove whereby said fitting portion is engaged within said groove so as to prevent removal of said pointer member from said pointer mounting member by outward movement of said pointer member relative to said pointer mounting member, said fitting portion having oppositely projecting protrusions on opposite sides of the stem of said fitting portion, which protrusions are in releasable, resilient engagement with indentations on said walls, whereby said pointer member is releasably fixed to said pointer mounting member and can be moved laterally along said fitting groove to adjust the position thereof.

* * * * *